United States Patent [19]
Mattausch et al.

[11] Patent Number: 4,893,184
[45] Date of Patent: Jan. 9, 1990

[54] ARRANGEMENT FOR DPCM-CODING WITH HIGH DATA RATE

[75] Inventors: Hans-Juergen Mattausch, Brunnthal-Faistenhhar; Fred Matthiesen; Matthias Schoebinger, both of Munich, all of Fed. Rep. of Germany

[73] Assignee: Siemens Aktiengesellschaft, Berlin and Munich, Fed. Rep. of Germany

[21] Appl. No.: 346,084

[22] Filed: May 1, 1989

[30] Foreign Application Priority Data

Jun. 14, 1988 [DE] Fed. Rep. of Germany ....... 3820234

[51] Int. Cl.$^4$ ............................................. H04N 7/12
[52] U.S. Cl. ..................................... 358/135; 358/136
[58] Field of Search ................. 358/135, 136, 13, 133

[56] References Cited

U.S. PATENT DOCUMENTS

| | | | |
|---|---|---|---|
| 4,743,967 | 5/1988 | Takenaka et al. | 358/136 |
| 4,748,503 | 5/1988 | Pirsch | 358/135 |

OTHER PUBLICATIONS

"Design of a DPCM Codec for VLSI Realization in CMOS Technology", by Peter Pirsch, in IEEE, vol. 73, No. 4, Apr. 1985, pp. 592–598.

"Architektur und Schaltkreistechnik Von CMOS-ICS Fur Die DPCM-Codierung Von Videosignalen", by Peter Pirsch, Mitteilung aus dem Forschungszentrum der Standard Elektrik Lorenz AG, Stuttgart, pp. 213–222.

Primary Examiner—James J. Groody
Assistant Examiner—Victor R. Kostak
Attorney, Agent, or Firm—Hill, Van Santen, Steadman & Simpson

[57] ABSTRACT

An arrangement for DPCM coding with high data rate. In a DPCM coder, wherein respective prediction values ( ) are subtracted from digitized picture element signals ($\hat{s}$), the difference signals that result represent the prediction error $\Delta$ supplied to a circuit element for outputting a quantization error (11) pertaining to a difference signal. In a following adder, quantization errors (q) are added to the prediction errors ($\Delta$), whereby the quantized prediction error ($\Delta q$) can be taken at the output of the following adder. For forming the reconstructed picture element signal ($s_R$), the quantization error (q) is added to the current picture element signal (s) in a first adder and is supplied to a first subtraction means via a predictor. In an embodiment of the circuit, a DPCM structure that has a shortest possible critical path for a DPCM structure that is composed of a quantizer, of an addition and of a register can be produced by dividing the predictor upon insertion or removal of individual registers.

16 Claims, 4 Drawing Sheets

ARRANGEMENT FOR DPCM-CODING WITH HIGH DATA RATE

BACKGROUND OF THE INVENTION

The present invention is directed to an arrangement for DPCM-coding with high data rates.

An arrangement for DPCM coding that, for example, is known from Proc. IEEE, Vol. 73, No. 4, April 1985, pages 592 through 598, particularly FIGS. 1, 2 and 4 therein, is set forth with reference to a fundamental circuit diagram shown in FIG. 1. A sequence of digitized picture element signals s is received at an input 1, these signals s being supplied via sample and hold stages that are not shown in detail. In order to reduce the data flow, an effort is made to remove redundant and irrelevant parts of the picture signal in order, for example, to be able to lower the bit transmission rate without thereby deteriorating the image quality. In detail, this occurs in that it is not the successive picture element signals that are transmitted via the transmission channel leading to a reception location, but rather, only the difference signals that are formed by taking the difference between a respectively current picture element signal s and a prediction value $\hat{s}$ calculated on the basis of the preceding picture element signals which are transmitted. Such a method is also referred to as difference pulse code modulation (DPCM).

According to FIG. 1, the difference formation required for a DPCM-coding is carried out in a subtractor 2 whose first input is connected to the input 1 and whose second input is connected to a predictor 3. Every difference signal $\Delta$ that is also referred to as prediction error is quantized in a quantizer 4, whereby the difference signal $\Delta q = \Delta + q$ affected with the quantization error q is coded in a coder 5 and is supplied to the transmission channel via an output 6. A recursive signal path is provided for forming the prediction value $\hat{s}$, this signal path connected from a circuit point 7 at the output side of the quantizer 4 to the second input of the subtractor 2. The signal path contains a first adder 8, a limiter means 9 and the predictor 3. The output of the predictor 3 is also connected to a second input of the first adder 8 that forms what is referred to as a reconstructed picture element signal $s_r$ by addition of the quantized difference signal $\Delta q$ and the prediction value $\hat{s}$. The predictor 3 supplies the prediction value $\hat{s}$ from at least one of the preceding picture element signals for every current picture element signal s.

When, according to FIG. 2, the current picture element lying in the line n in a video picture m is referenced X, the picture element sampled immediately therebefore is referenced A, the picture element of the preceding line n−1 corresponding to X is referenced C and the picture elements neighboring the latter and sampled immediately before or after that are referenced B and D and when, further, the corresponding picture elements of the preceding picture m−1 are referenced X' and A' through D', the following then results: the picture element signals of at least one of the points A through D can be utilized for the formation of the prediction value $\hat{s}$ for the picture element signal of X, whereby one speaks of a two-dimensional (2D) prediction. When the picture element signals of at least one of the picture elements X' and A' through D' are used exclusively or in addition thereto, then there is a three-dimensional (3D) prediction. In the former instance, the prediction value $\hat{s}$ can, for example, be calculated according to the 2D estimation equation:

$$\hat{s} = \alpha \cdot s_A + \beta \cdot s_B + \gamma \cdot s_C + \delta \cdot s_D$$

In the latter instance, for example, the prediction value s can be calculated according to the 3D estimation equation: $\hat{s} = \alpha \cdot s_A + \beta \cdot s_X$, whereby $s_A$ references the reconstructed picture element signal of the picture element A, $s_B$ references that of the picture element B, etc., and whereby the coefficience $\alpha$, $\beta$, $\gamma$, and $\delta$ are weighing factors that are allocated to the individual picture element signals.

The publication "Architektur und Schaltkreistechnik in CMOS-ICs für die DPCM-Codierung von Videosignalen" by Peter Pirsch in the Mitteilung des Forschungszentrums der SEL AG in Stutgart, pages 213–222, provides an overview of the principle of DPCM technology. A DPCM system having two-dimensional prediction and DPCM architecture solutions are presented. FIG. 5 of the cited publication sets forth a modified DPCM system having four-stage prediction error identification and a predictor. The time-critical path in this arrangement is merely composed of a subtractor, a quantizer and a register. Only further paths wherein two additions or one addition and one subtraction are required between two successive registers are present in addition to this path. For the reasons recited in the third paragraph of page 218, it is necessary to utilize a limiter function in the arrangement of FIG. 5 not within a loop but at the input side. In order to prevent overflows and under flows, the numerical range of the input signal is thus limited, this, however, being undesirable in many cases. The limiter function should only be activated for overflows or under flows arising in the DPCM arrangement.

SUMMARY OF THE INVENTION

An object of the present invention is to provide arrangement for DPCM coding wherein a fast signal processing is guaranteed for an optimally simple circuit structure.

The present invention is utilized in an arrangement for DPCM coding with high data rate, whereby prediction values are subtracted from digitized picture element signals at an input and the difference signals thus obtained are utilized for signal transmission after a processing. The arrangement has a recursive signal path that has a first adder for forming reconstructed picture element signals ($s_R$), a predictor for the formation of the estimated values, and a first subtraction means for the formation of the difference signals. In the present invention, for processing the difference signals, these are conducted to a first input of a second adder via a means for outputting a quantization error pertaining to a difference signal. A second input of the second adder receives the difference signals and signals for signal transmission can be taken at the output of the second adder. An output of the means for outputting a quantization error belonging to a difference signal is connected to the first input of the first adder and a second input receives the digitized picture element signal. An output of the first adder is connected to the first subtraction means via the predictor.

The predictor is divided into a one-dimensional predictor and into a two-dimensional/three-dimensional predictor, the two/three-dimensional predictor being connected between the output of the first adder and the first subtraction means and the one-dimensional predictor being connected between the output of the first adder and a second subtraction means. The second subtraction means is located between the first subtraction means and the means for outputting a quantization error pertaining to a difference signal. The one-dimensional predictor contains a series circuit composed of a register and of a weighing element. Alternatively, the predictor can be divided into a one-dimensional and into a two/three-dimensional predictor, wherein the two/three dimensional predictor is connected between the output of the first adder and the first subtraction means and the one-dimensional predictor is divided into a first and into a second predictor part. The second predictor part is connected between the first input of the first adder and a second subtraction means and the first predictor part is connected between the first input of the first adder and a third subtraction means. The third subtraction means is located preceding the first subtraction means and the second subtraction means is located following the first subtraction means. The first and second predictor part each contain a series circuit of a register and of a weighing element.

A first register is arranged between the third and first subtraction means and a second register is arranged following the second subtraction means. A series circuit composed of a third and of a fourth register has a first terminal connected to the second input of the first adder and has a second terminal receiving the digitized picture element signals (s). The first predictor part is connected to the third subtraction means via the third register. A frame or line memory contained in the two/three-dimensional predictor is shortened by a further register.

The arrangement further contains first and second multiplexers, an overflow recognition and a fourth subtraction means. The overflow recognition is connected between the output of the first adder and control inputs of the first and second multiplexers. The first input of the first multiplexer is connected to a lower limit value (G−), the second input thereof is connected to an upper limit value (G+) and a third input of the first multiplexer is connected to the output of the first adder. An output of the first multiplexer is connected to the two/three-dimensional predictor. The second multiplexer is connected to the first input and with a first output between the second subtraction means and the second register. The second and third inputs of the second multiplexer are connected to the fourth subtraction means, whereby a first input of the fourth subtraction means is connected to the output of the two/three-dimensional predictor and a second input of the third subtraction means is connected to a circuit point between the third and fourth registers.

The fourth subtraction means contains a first, second and third subtractor, whereby a first and second input of the first subtractor is connected to the first and second inputs of the fourth subtraction means, an output of the first subtractor being connected to a first inputs of the second and third subtractor. The second input of the second subtractor is connected to a lower limit value (G−) and the second input of the third subtractor (35) is connected to an upper limit value (G+). The outputs of the second and third subtractors, each form the first and second outputs of the fourth subtraction means. A weighing element is connected between the upper limit value (G+) and the second input of the second subtractor and a further weighing element is connected between the lower limit value (G−) and the second input of the third subtractor. The first and second predictor parts each contain a weighing element.

The advantage obtainable with the present invention is that a desired limiter function need not be provided at the input side in a development of the present invention and the arrangement in this development has the shortest possible ciritcal path (a quantization access, an addition and a register) for a DPCM system. In case a limiting is required for the reconstructed value (as, for example, in the COST specification for the ISDN broadband system), then the critical path is lengthened only by an overflow recognition and by a multiplexer. It is also advantageous that, by contrast to systems that have a similarly short, critical path by recursive insertion into the prediction equation (see FIG. 5 on page 219 of the second publication referenced above), the value from the 2D or 3D prediction is subtracted only once. The number of adders is lower. In most quantization characteristics, the value range of the quantization error is smaller than the value range of the representative values. Therefore, the required memory need output fewer places and is therefore smaller. For an external memory, the I/O requirements is likewise lower when compared to arrangements of the traditional type.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
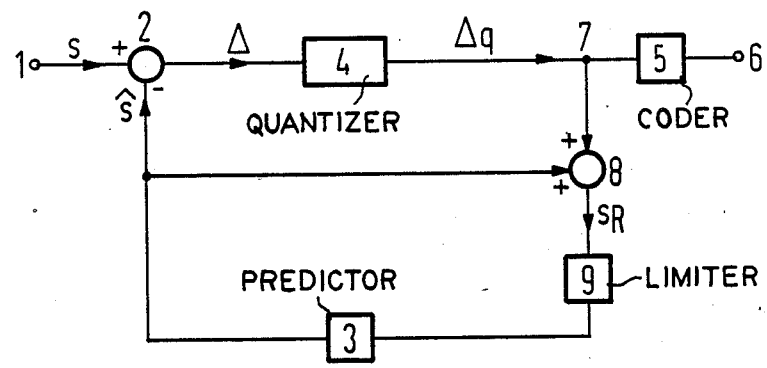
FIG. 1 is a fundamental block diagram of a prior art arrangement for DPCM coding.
Figure 2:
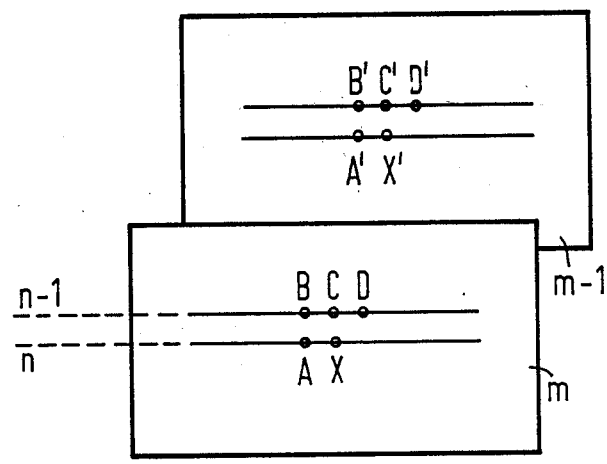
FIG. 2 is an illustration of individual picture elements of two successive video pictures for explaining FIG. 1.
Figure 3:
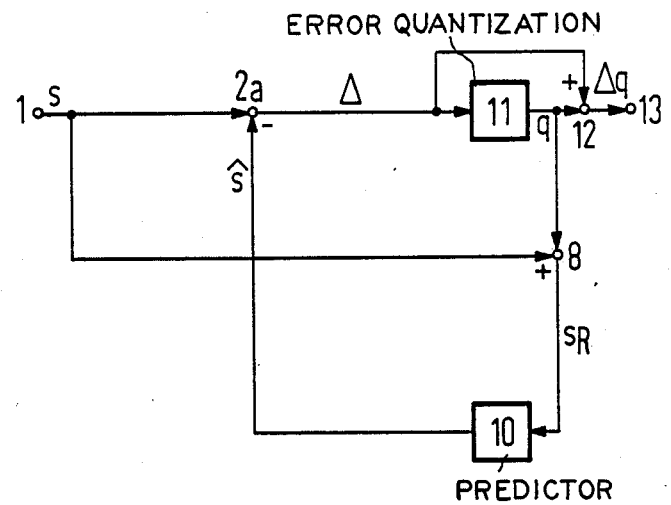
FIG. 3 is a block diagram of a first exemplary embodiment of the present invention.

In the first exemplary embodiment of FIG. 3, as well as, in the fundamental circuit diagram of the known arrangement according to FIG. 1, the difference formation required for a DPCM coding occurs in a subtractor 2a whose first input is connected to an input 1 of the DPCM circuit and whose second input is connected to a predictor 10. Instead of being supplied to a quantizer, all difference signals or prediction errors are supplied to a means for outputting a quantization error 11 pertaining to a difference signal. Further, the arrangement of the present invention according to FIG. 3 has an additional adder 12 whose first input is connected to the output of the last-cited arrangement and is connected to the output of the subtractor 2a via a second input. The quantized prediction error Δ q arises within this adder 12 in that the quantization error q is added to the prediction error Δ at the output of the subtractor 2a. An output 13 of the further adder 12 which supplies the quantized prediction error Δ q is connected to a transmission channel via a coder (not shown). A recursive signal path is provided for the formation of the prediction value s, this recursive signal path connected before the output of the arrangement 11 for outputting a quantization error pertaining to a difference signal. The path contains a first adder 8 and the predictor 10, and is connected to the second input of the subtractor 2a.

The output of the first adder 8, exactly like the DPCM structure of FIG. 1, supplies what is referred to as reconstructed picture elements signal $s_R$. According to the prior art DPCM structure of FIG. 1, this picture element signal $s_R$ arises from an addition of the prediction value s and the quantized prediction error Δ q. According to the DPCM structure of the present invention shown in FIG. 3, the first adder 8 is supplied with the quantizer error q pertaining to a defined difference signal via its first input instead of being supplied with the quantized prediction error Δ q and the current picture element signal s that is supplied at the input 1 is connected to the second input of the first adder 8. The reconstructed picture element signal $s_R$ thus derives from an addition of the picture element signal s and of the quantizer error q belonging to the difference signal. The prediction and the calculation of the prediction error Δ in the circuit of the present invention according to FIG. 3 experiences no modification whatsoever. The quantizer error q is allocated to the prediction error Δ by a memory, a programmable logic array (PLA) or by an arrangement of logical gates.

The use of the means 11 for outputting a quantization error pertaining to a difference signal now makes it possible to implement a simpler circuit structure in comparison to the traditional state of the art in DPCM technology. The memory required for this purpose generally has a lower number of places than the quantizer in the DPCM structure of the traditional arrangement since the greater value range of the representative values is contrasted via the quantization characteristic to a smaller value range of associated quantization errors.

Figure 4:
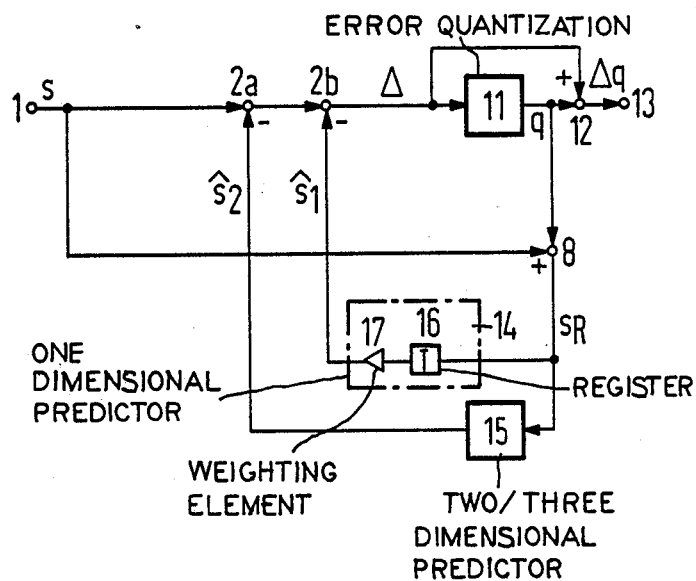
FIG. 4 is a block diagram of a first development of the arrangement of FIG. 3.

FIG. 4 shows a first development of the arrangement of FIG. 3 wherein the predictor is divided into a one dimensional (ID) and into a two dimensional (2D/three dimensional (3D) predictor 14, 15. The one-dimensional predictor 14 thereby processes the immediately preceding value, whereas the two-dimensional or three-dimensional predictor 15 processes all other values. Included among these other values are, for example, the picture elements of the preceding line or the picture elements of the preceding frame. The parts $s_1$, $s_2$ of the one-dimensional predictor 14 or of the two-dimensional/three-dimensional predictor 15 are successively subtracted from the current picture element signal, a second subtractor 2b being required for this purpose. This second subtractor 2b is connected between the first subtractor 2a and the means 11 for outputting a quantization error pertaining to a difference signal, so that the output of the first subtractor 2a is connected to the first input of the second subtractor 2b and the output of the second subtractor 2b is connected to the input of the means 11. The second input of the second subtractor 2b is connected via the one-dimensional predictor 14 to the output of the first adder 8, so that the reconstructed picture element signal $s_R$ is supplied at the input of the one-dimensional predictor 14. According to FIG. 4, the one-dimensional predictor 14 is formed of a series circuit of a register 16 and of a weighing element 17, whereby the weighing element 17 weighs the reconstructed picture element signal $s_R$ with the value α. The one-dimensional predictor 14 thereby delays the reconstructed picture element signal $s_R$ by one clock cycle and multiplies it by a weighing factor α. The fundamental connection of the arrangement of FIG. 4 corresponds to the DPCM structure of FIG. 3, so that the quantizer 4 belonging to the prior art is replaced by a means 11 for outputting a quantization error pertaining to a difference signal together with a following adder 12.

Figure 5:
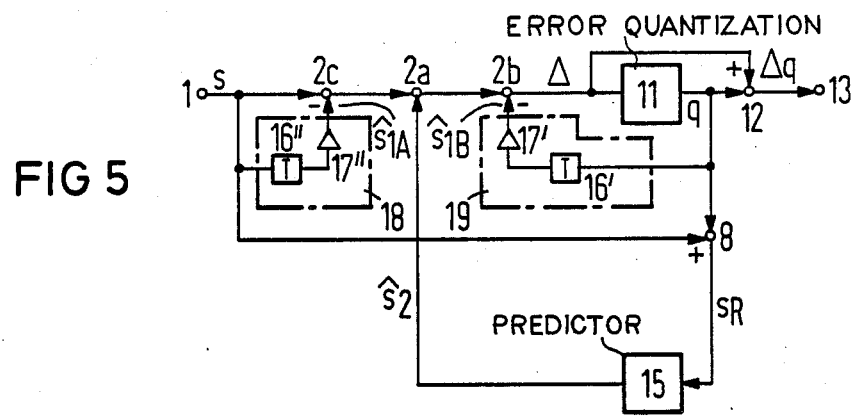
FIG. 5 is a block diagram of a second development of the arrangement of FIG. 3.

FIG. 5 shows a second development of the DPCM structure of FIG. 3. Since the reconstructed picture element $s_R$ is calculated from the addition of the current picture element s and of the quantization q belonging to the difference signal, the one-dimensional predictor can in turn be divided into a first part 18 that delays the current picture element s and multiplies it by the weighing factor α and into a second part 19 that delays the quantizer error q belonging to the difference signal and likewise multiplies by the weighing factor α. These two parts $s_{1A}$, $s_{1B}$ are likewise successively subtracted from the current picture element signal s, so that two additional subtractors 2b, 2c are required in comparison to the DPCM structure of FIG. 3. One input of the second additional subtractor 2c connected to the current picture element signal s, whereas a second input is connected to the input 1 of the DPCM structure via the first part 18 of the one-dimensional predictor. The output of the second additional subtractor 2c is connected to the first input of the first subtractor 2a and the output of the first subtractor 2a is connected to the first input of third, additional subtractor 2b and the output of this subtractor 2b is connected to the means 11 for outputting a quantization error pertaining to a difference signal. The second part 19 of the one-dimensional predictor is arranged between the output of the means 11 for outputting a quantization error pertaining to a difference signal and the second input of the third subtractor 2b. Both the first part 18 as well as, the second part 19 of the one-dimensional predictor are composed of a series circuit of a register 16", 16' and of a following weighing element 17", 17' that multiplies the current picture element signal s or the quantization error q belonging to the difference signal by the weighing factor α. The remaining interconnection, particularly of the 2D or of the 3D predictor, as well as, the means 11 for outputting a quantization error pertaining to a difference signal and having the following adder 12 correspond to the DPCM structure of FIG. 4.

Figure 6:
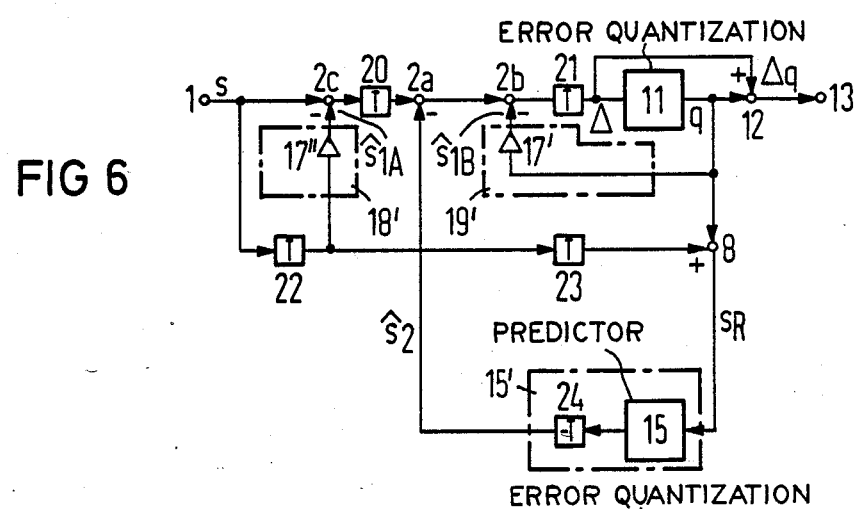
FIG. 6 is a block diagram of a development of the arrangement of FIG. 5 having a shortest possible critical path.

A development of the DPCM structure of the present invention according to FIG. 5 having an optimally short cirtical path is shown in FIG. 6. Exactly as in the DPCM arrangement of FIG. 5, the predictor is divided into a 2D or 3D predictor 15' and into a 1D predictor that is composed of a first and a second part 18', 19'. A further comparison to the DPCM structure of FIG. 5 shows that some registers are arranged at a different location or are augmented, whereas, by contrast, a register 24 is removed from the line or frame memory of the 2D or 3D predictor, this being indicated with "−T". This makes it possible to construct the shortest possible critical path (a quantizer access, an addition and a register; insofar as the weighing factor α is composed of a power of two and, thus, a bus shift requiring no calculating time can be realized) to be constructed for a DPCM structure that guarantees a high processing speed of the DPCM structure. As a result of the relocating of the registers in the DPCM structure, it is also necessary to remove one register in the input region and in the output region in order to obtain the same function as in FIG. 5. When, as shown here, this is omitted the latency time of the circuit, i.e. the time from the input of an input value to the output of the appertaining output value, is lengthened; the function of the DPCM structure, however, is not altered. The structural format, particularly of the arrangement of the first, second and third subtractors 2a, 2c, 2b, of the first adder 8, as well as of the means 11 for outputting a quantization error pertaining to a difference signal and having following adder 12 and the arrangement of the 2D or 3D predictor 15' is the same as that of the DPCM structure of FIG. 5, with the following exceptions. The first and second parts 18', 19' of the one-dimensional predictor is not composed of a series circuit of a register and of a weighing element but is merely composed of a weighing element 17'', 17' in both instances. The 2D or 3D predictor 15' whose line or frame memory was abbreviated by one register 24 is in the recursive signal path. This is indicated in the arrangement of FIG. 6 in that a 2D or 3D predictor 15 used in the FIG. 4 and 5 is followed by a "−T" register 24. Further registers 20, 21 in comparison to the DPCM structure of FIG. 5 are illustrated between the first and second subtractors 2a, 2c, as well as, between the third subtractor 2b and the input of the means 11 for outputting a quantization error pertaining to a difference signal, whereas the signal path having the current picture element signal to the second input of the first adder 8 is provided with a series circuit of two registers 22, 23. The first part 18' of the one-dimensional predictor thereby has its first input connected between these latter two registers 22, 23 and has its second terminal connected to the second input of the second subtractor 2c.

Figure 7:
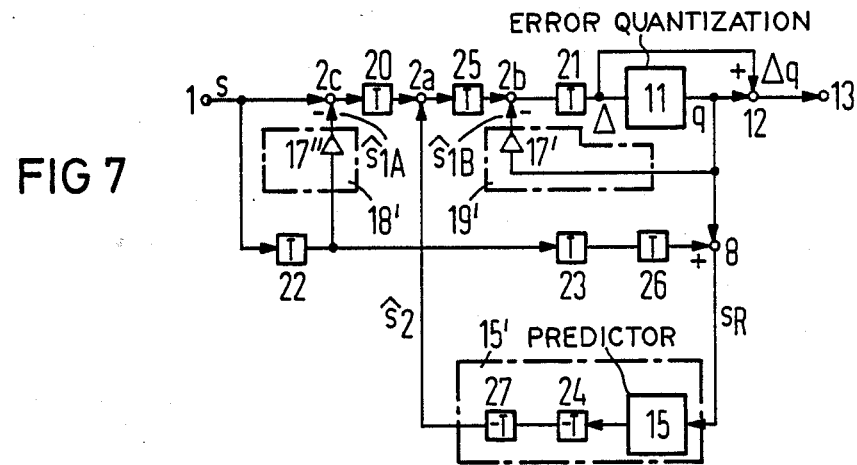
FIG. 7 is a block diagram of a development of the arrangement of FIG. 6 having additional registers.

FIG. 7 shows a development of the DPCM structure of FIG. 6 having an additional register that is arranged between the first and third subtractors 2a, 2b. This measure makes it possible for adders that are slow in comparison to the memory access time to provide an effective signal processing for DPCM structure. In general, however, this will not be necessary since two cascaded additions sequence faster than one memory access plus one addition. However, should it be required to arrange a register 25 between the first and third subtractors 2a, 2b, then a further register 26 is also to be provided for the second input of the first adder and the frame or line memory of the 2D or 3D predictor is to be shortened by a total of two registers 24, 27. The fundamental arrangement of the DPCM structure of FIG. 7 thereby corresponds to the arrangement of FIG. 6, so that the shortest possible critical path composed of a quantizer access, of an addition and of a register is also present here.

Figure 8:
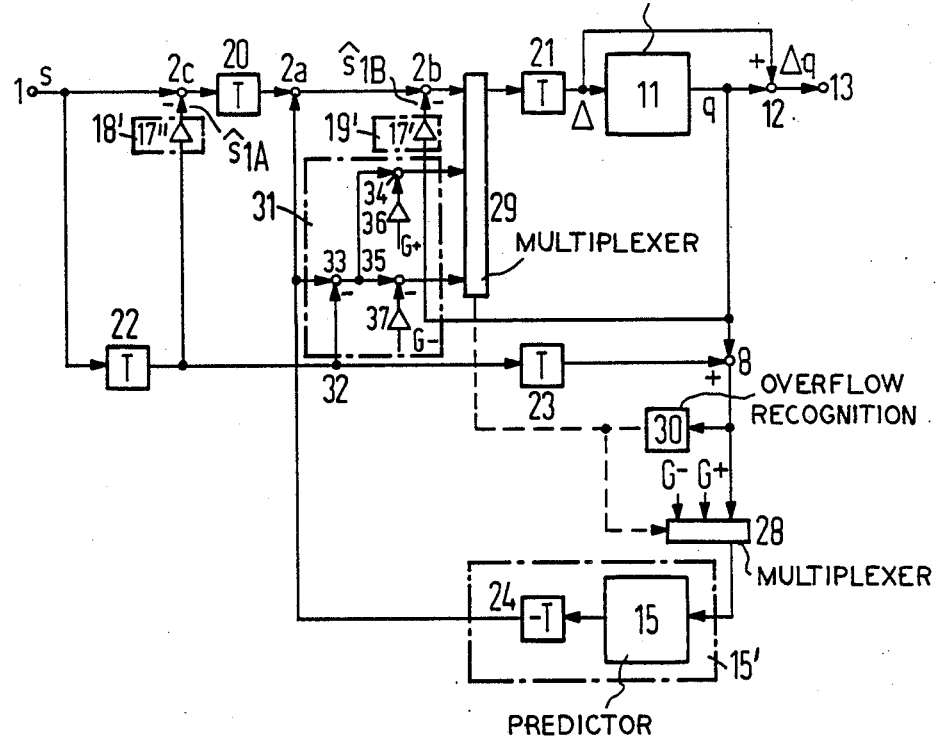
FIG. 8 is a block diagram of a DPCM arrangement of the present invention having limiter function.

The value range of the reconstructed picture element signal must be limited in many DPCM systems. This limiting function can be integrated in the manner shown in FIG. 8. The three statuses, below, within and above the value range, are recognized by an overflow recognition. This overflow recognition controls a multiplexer that selects between the three values, a lower limit value, an unlimited value and an upper limit value. For the fundamental connection of the DPCM arrangement of FIG. 8, one again proceeds on the basis of an arrangement of FIG. 6, whereby the shown arrangement also has an overflow recognition 30, two multiplexers 28, 29, as well as, three subtractors 33, 34, 35 available. The overflow recognition 30 is thereby connected to the output of the first adder 8 and its output controls the first and the second multiplexers 28, 29. Each of the two multiplexers has three inputs and one output, whereby the first multiplexer 28 is respectively connected with a lower or upper limit value G−, G+ at its first two inputs. The first multiplexer 28 has a third input connected to the output of the first adder 8 in common with the input of the overflow recognition. The output of the first multiplexer 28 that carries the first, reconstructed picture element signal $s_R$ is applied to the input of the 2D or 3D predictor 15'. The second multiplexer 29 has each of its first two inputs connected to the output of a fourth and of a fifth subtractor 34, 35. Both inputs of these subtractors 34, 35 are connected in parallel and are connected to the output of a sixth subtractor 33 whose first input is connected to the terminal point 32 between the third and fourth registers 22, 23 and whose second input receives the reconstructed picture element signal $s_R$ via the 2D or 3D predictor 15'. The 2D or 3D predictor 15' thereby again has a line or frame memory that is shortened by one register 24 in comparison to the corresponding predictor arrangement of FIG. 3. The maximum limit value G+ is connected to the second input of the fourth subtractor 34 via a weighing element 36 and is multiplied by the weighing factor $\alpha$ by the weighing element 36, whereas the second input of the fifth subtractor 35 is connected to the lower limit value G− via a further weighing element 37 and this weighing element likewise multiplies the lower limit value by the weighing factor $\alpha$. The third input of the second multiplexer 29 is connected to the output of the third subtractor 2b and the output of the second multiplexer 29 is connected to the input of the second register 21. Instead of a limiter arrangement, a parallelization that was already disclosed in German patent application P 37 14 130.9, is thereby used in the path for the one-dimensional prediction instead of a limiter arrangement. This path calculates:

$$\Delta = s - \hat{s}_{1A} - \hat{s}_{1B} - \hat{s}_2$$

for the unlimited case, i.e. the prediction error $\Delta$ is calculated from the current picture element signal s minus the prediction value $s_2$ from the 2D/3D predictor as well as minus the signal from the first and second part of the one-dimensional predictor $s_{1A}$ and $s_{1B}$. The equation:

$$\Delta = s - \hat{s}_2 - (\alpha \cdot G+)$$

derives for insertion of the upper limitation, i.e. the prediction error $\Delta$ derives for the current picture element s minus the prediction value $s_2$ from the 2D/3D predictor as well as minus the upper limit value G+ multiplied by $\alpha$. The prediction error:

$$\Delta = \hat{s} - \hat{s}_2 - (\alpha \cdot G-)$$

derives for insertion of the lower limitation, i.e. the prediction error $\Delta$ derives from the current picture element signal s minus the prediction value $s_2$ from the 2D/3D predictor and minus the lower limit value G− multiplied by $\alpha$. Just like the DPCM structure of FIGS. 6 and 7, this DPCM structure has a shortest possible critical path composed of a quantizer access, an addition and a register. An optimally high processing speed is thus also possible in this arrangement.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An arrangement for DPCM coding with high data rate, whereby prediction values are subtracted from digitized picture element signals at an input (1) and difference signals thus obtained are utilized for signal transmission after a processing, the arrangement having a recursive signal path that has a first adder (8) for forming reconstructed picture element signals ($s_R$), a predictor (10) for the formation of estimated values, and a first means for subtraction (2a) for the formation of the difference signals, comprising, for processing the difference signals, the difference signals are supplied to a first input of a second adder (12) via a means for outputting a quantization error (11) pertaining to a difference signal of the difference signals; a second input of the second adder (12) receiving the difference signals, signals for signal transmission being taken at an output (13) of the second adder (12); an output of the means for outputting a quantization error (11) of a difference signal connected to a first input of the first adder (8), a second input of the first adder (8) receiving the digitized picture element signal; and an output of the first adder (8) connected to the first subtraction means (2a) via the predictor (10).

2. The arrangement according to claim 1, wherein the predictor is divided into a one-dimensional predictor (14) and into a two/three dimensional predictor (15); wherein the two/three-dimensional predictor (15) is connected between the output of the first adder (8) and the first subtraction means (2a) and the one-dimensional predictor (14) is connected between the output of the first adder (8) and a second subtraction means (2b); and wherein the second subtraction means (2b) is located between the first subtraction means (2a) and the means for outputting a quantization error (11) of a difference signal of the difference signals.

3. The arrangement according to claim 2, wherein the one-dimensional predictor (14) contains a series circuit composed of a register (16) and a weighing element (17).

4. The arrangement according to claim 1, wherein the predictor is divided into a one-dimensional and into a two/three dimensional predictor; wherein the two/three dimensional predictor (15) is connected between the output of the first adder (8) and the first subtraction means (2a); wherein the one-dimensional predictor is divided into a first and into a second predictor part (18, 19); wherein the second predictor part (19) is connected between the first input of the first adder (8) and a second means for subtraction (2b) and the first predictor part (18) is connected between the second input of the first adder (8) and a third means for subtraction (2c); wherein the third subtraction means (2c) is located preceding the first subtraction means (2a) and the second subtraction means (2b) is located following the first subtraction means (2a).

5. The arrangement according to claim 4, wherein the first and second predictor parts (18, 19) each contain a series circuit of a register (16', 16") and of a weighing element (17', 17"), respectively.

6. The arrangement according to claim 4, wherein a first register (20) is connected between the third and first subtraction means (2c, 2a) and a second register (21) is connected following the second subtraction means (2b); wherein a series circuit composed of a third and of a fourth register (22, 23) has a first terminal connected to the second input of the second adder (8) and has a second terminal receiving the digitized picture element signals (s); wherein the first predictor part (18') is connected to the third subtraction means (2c) via the third register (22); and wherein a frame or line memory contained in the two/three-dimensional predictor (15) is shortened by one register (24).

7. The arrangement according to claim 6, wherein a fifth register (25) is connected between the first and second subtraction means (2a, 2b) and a sixth register (26) is connected between the first terminal of a series circuit composed of third and fourth registers (22, 23) and the second input of the first adder (18); and wherein a frame or line memory contained in the two/three dimensional predictor (15') is shortened by a further register (27).

8. The arrangement according to claim 7, wherein the arrangement contains first and second multiplexers (28, 29), an overflow recognizer (30) and a fourth means for subtraction (31); wherein the overflow recognition (30) is connected between the output of the first adder (8) and a control input of each of the first and second multiplexer (28, 29) and a first input of the first multiplexer (28) is connected to a lower limit value (G−), a second input thereof is connected to an upper limit value (G+) and a third input of the first multiplexer (28) is connected to the output of the first adder (8); wherein an output of the first multiplexer (28) is connected to the two/three dimensional predictor (15'); and wherein the second multiplexer (29) is connected with a first input and a first output between the second subtraction means (2b) and the second register (21); wherein second and third inputs of the second multiplexer (29) are connected to the fourth subtraction means (31), whereby a first input of the fourth subtraction means (31) is connected to the output of the two/three-dimensional predictor (15') and a second input of the third subtraction means (31) is connected to a circuit point (32) between the third and fourth registers (22, 23).

9. The arrangement according to claim 8, wherein the fourth subtraction means (31) contains first, second and third subtractors (33, 34, 35), whereby first and second inputs of the first subtractor (33) are connected to the first and second inputs of the fourth subtraction means (31), respectively, an output of the first subtractor (33) being connected to first inputs of the second and third subtractor (34, 35); wherein the second input of the second subtractor (34) is connected to a lower limit value (G−) and the second input of the third subtractor (35) is connected to an upper limit value (G+); wherein outputs of the second and third subtractors (34, 35) each form the first and second outputs of the fourth subtraction means (31), respectively.

10. The arrangement according to claim 9, wherein a weighing element (36) is connected between the upper limit value (G+) and the second input of the second subtractor (34) and a further weighing element (37) is connected between the lower limit value (G−) and the second input of the third subtractor (35).

11. The arrangement according to claim 10, wherein the first and second predictor parts (18', 19') each contain a weighing element (17", 17'), respectively.

12. The arrangement according to claim 6, wherein the first and second predictor parts (18', 19') each contain a weighing element (17", 17'), respectively.

13. The arrangement according to claim 6, wherein the arrangement contains first and second multiplexers (28, 29), an overflow recognizer (30) and a fourth means for subtraction (31); wherein the overflow recognition (30) is connected between the output of the first adder (8) and a control input of each of the first and second multiplexer (28, 29) and a first input of the first multiplexer (28), is connected to a lower limit value (G−), a second input thereof is connected to an upper limit value (G+) and a third input of the first multiplexer (28) is connected to the output of the first adder (8); wherein an output of the first multiplexer (28) is connected to the two/three dimensional predictor (15'); and wherein the second multiplexer (29) is connected with a first input and a first output between the second subtraction means (2b) and the second register (21); wherein second and third inputs of the second multiplexer (29) are connected to the fourth subtraction means (31), whereby a first input of the fourth subtraction means (31) is connected to the output of the two/three-dimensional predictor (15') and a second input of the third subtraction means (31) is connected to a circuit point (32) between the third and fourth registers (22, 23).

14. The arrangement according to claim 13, wherein the fourth subtraction means (31) contains first, second and third subtractors (33, 34, 35), whereby first and second inputs of the first subtractor (33) are connected to the first and second inputs of the fourth subtraction means (31), respectively, an output of the first subtractor (33) being connected to first inputs of the second and third subtractor (34, 35); wherein the second input of the second subtractor (34) is connected to a lower limit value (G−) and the second input of the third subtractor (35) is connected to an upper limit value (G+); wherein outputs of the second and third subtractors (34, 35) each form the first and second outputs of the fourth subtraction means (31), respectively.

15. The arrangement according to claim 14, wherein a weighing element (36) is connected between the upper limit value (G+) and the second input of the second subtractor (34) and a further weighing element (37) is connected between the lower limit value (G−) and the second input of the third subtractor (35).

16. The arrangement according to claim 15, wherein the first and second predictor parts (18', 19') each contain a weighing element (17", 17'), respectively.

* * * * *